United States Patent
Shirani

(10) Patent No.: US 7,221,196 B2
(45) Date of Patent: May 22, 2007

(54) LOW-POWER LOW-VOLTAGE MULTI-LEVEL VARIABLE-RESISTOR LINE DRIVER

(75) Inventor: Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 0 days.

(21) Appl. No.: 10/993,107

(22) Filed: Nov. 18, 2004

(65) Prior Publication Data

US 2005/0122143 A1 Jun. 9, 2005

(51) Int. Cl.
*H03K 3/00* (2006.01)

(52) U.S. Cl. ...................... 327/112; 327/423

(58) Field of Classification Search ................ 327/108, 327/110, 112, 423, 487
See application file for complete search history.

(56) References Cited

U.S. PATENT DOCUMENTS

| | | | | |
|---|---|---|---|---|
| 5,818,629 A | * | 10/1998 | Kinoshita | 359/337.11 |
| 6,157,215 A | * | 12/2000 | Gabara et al. | 326/83 |
| 6,204,692 B1 | * | 3/2001 | Nakagawa | 326/83 |
| 6,351,185 B1 | * | 2/2002 | Amrany et al. | 330/253 |
| 6,448,815 B1 | * | 9/2002 | Talbot et al. | 326/86 |
| 6,741,095 B2 | * | 5/2004 | Abrosimov et al. | 326/30 |
| 6,751,782 B2 | * | 6/2004 | Levin et al. | 716/1 |
| 6,762,896 B2 | * | 7/2004 | Yoshizawa et al. | 360/67 |
| 6,771,097 B1 | * | 8/2004 | Poh Ho et al. | 327/108 |
| 6,943,588 B1 | * | 9/2005 | Luo et al. | 326/86 |
| 2004/0264267 A1 | * | 12/2004 | Nishio et al. | 365/200 |

OTHER PUBLICATIONS

Gabara et al., "Digitally Adjustable Resistors in CMOS for High Performance Applications" IEEE Journal of Solid State Circuits, vol. 27, No. 8, Aug. 1992, pp. 1176-1185.*

* cited by examiner

*Primary Examiner*—Linh My Nguyen
*Assistant Examiner*—Thomas J. Hiltunen
(74) *Attorney, Agent, or Firm*—Sawyer Law Group LLP

(57) ABSTRACT

A low-power multi-level pulse amplitude modulation (PAM) line driver using variable resistors is disclosed for transmitting digital data over controlled-impedance transmission lines. This invention discloses the design of a multi-level PAM driver for high-speed wireline communication, with up to four times improvement in power efficiency over conventional drivers. Two key requirements for high-speed line drivers are first generating the target voltage level onto the controlled-impedance line, and second being impedance matched to the line itself to eliminate signal reflections from the transmitter back to the line. The driver in accordance with the present invention satisfies both of these requirements at very high power efficiency.

17 Claims, 4 Drawing Sheets

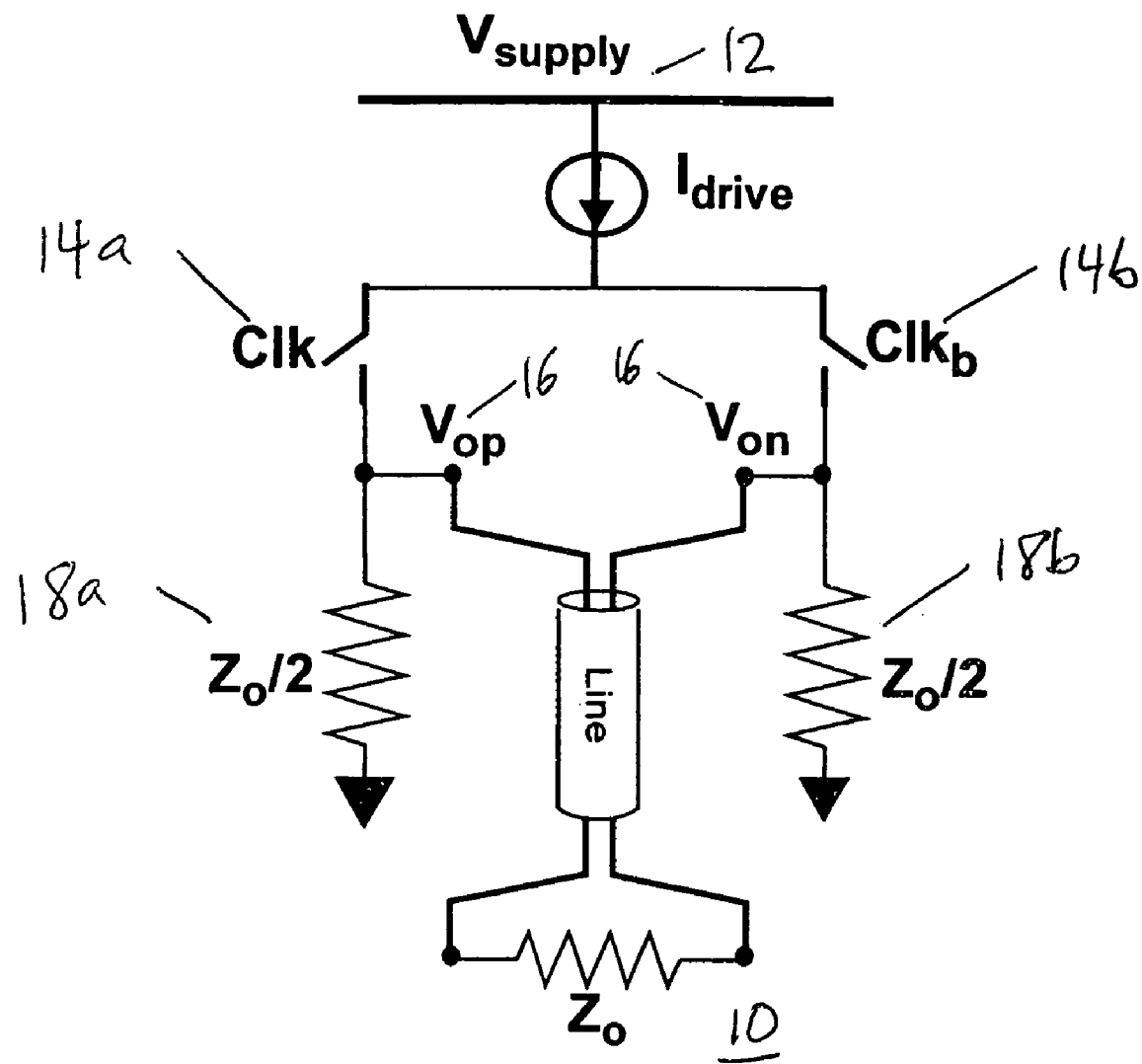
Figure1: Conventional Source/Emitter-coupled Line Driver

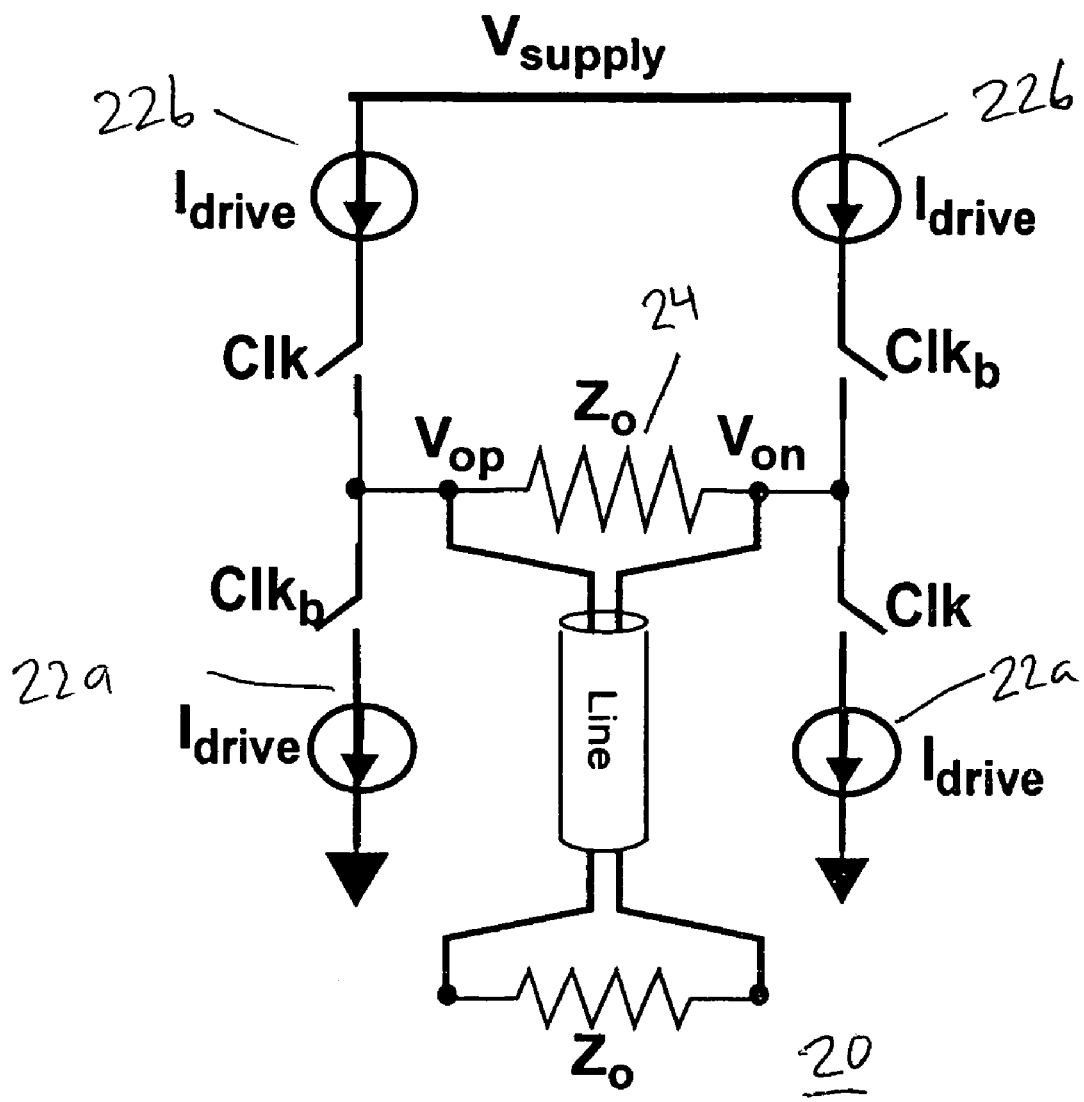
Figure 2: H-bridge Push-Pull Line Driver

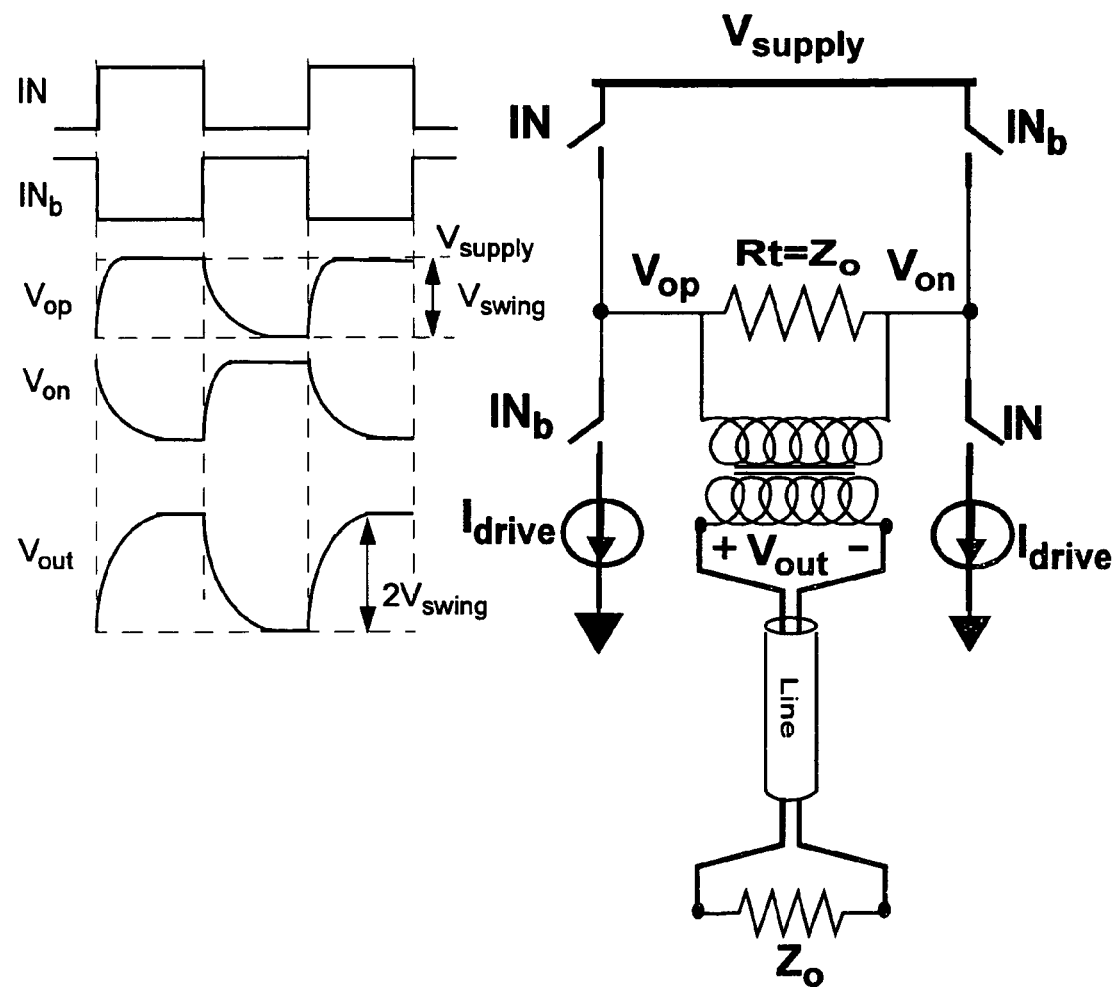
Figure 3: Modified H-bridge line driver for low-voltage operation

_US 7,221,196 B2_

LOW-POWER LOW-VOLTAGE MULTI-LEVEL VARIABLE-RESISTOR LINE DRIVER

FIELD OF THE INVENTION

The present invention relates generally to the field of communications, and in particular, to line drivers utilized for communications.

BACKGROUND OF THE INVENTION

Communication links require a driver to transmit information into the channel from transmitter to receiver. In wireline communications, the line drivers typically must satisfy two requirements: first generate a certain voltage swing across the transmission line, and second have an output impedance that is matched to the line characteristic impedance to absorb signals arriving at the transmitter and avoid reflections back to the line. In digital data transmission, information is sent using different modulations. One of the most common types of data modulation is pulse amplitude modulation (PAM), where each group of data bits are presented by a voltage level that is transmitted into the channel. Data modems and 100Base-T/1000Base-T Ethernet transceivers are examples of links that use multi-level signaling or PAM to transmit information. Information typically needs to be transmitted over distant and lossy channels. To ensure a minimum signal level at the receive end, the driver must generate a high enough signal power at transmit end. As a result, the power efficiency of the drivers in most communication links is of great importance, since significant portion of transceiver power is typically burned in the driver and its related circuitry.

FIG. 1 shows an example of a conventional commonly-used differential line driver 10, also known as common-source or common-emitter stage. The line driver 10 comprises a tail current source 12 and a pair of switches 14a and 14b that steer the current from one branch to the other. Each branch of the driver is terminated to a voltage source 16 by a fixed resistor 18a and 18b that is matched to the line single-ended charateristic impedance (or half its differential impedance). The effective impedance at the output of the driver is fixed and equal to the parallel resistance of the termination impedance and line single-ended impedance (i.e. $Z_o/2 \| Z_o/2 = Z_o/4$). The amplitude of the output signal is controlled by the amount of the current steered into either of the equivalent parallel resistors, being $Z_o/4$. Accordingly, for the conventional driver, to deliver a max swing of 1V (or 2V differential pk—pk) into the line, the driver current is high due to the high single ended impedance.

Another example of a line driver is the H-bridge topology 20 as shown in FIG. 2. This topology 20 differs from the conventional driver 10 of FIG. 1 in that it has current steering branches 22a and 22b both at the bottom and top, respectively, and has a single termination resistor 24 equal to line impedance across its outputs nodes. Thus, H-bridge bottom branch 22a pulls the same current that its top branch 22b pushes into the equivalent line and termination impedance (i.e. $Z_o \| Z_o = Z_o/2$), theoretically resulting in twice the current efficiency of the convential type in FIG. 1. However, in the H-bridge design to keep the current sources in saturation, it requires twice the headroom of a conventional source-coupled design for the current source devices, thus typically requires a higher supply voltage.

A design that solves the headroom problem of H-bridge topology is disclosed in U.S. Pat. No. 6,175,255, entitled Line Driver Circuit for Low Voltage and Low Power Applications by Jidentra and is shown in FIG. 3. In this topology the top current sources are removed and only the top switches that do not have a headroom requirement are left in the top branches. As shown in the waveforms in FIG. 3, the top voltage level of the stage output is in fact supply voltage, and thus leaving enough voltage headroom for the bottom current sources. However, during the rise period that one of the top switches is shorted, the resistance at the rising output node $V_{op}$ or $V_{on}$ becomes very low. Thus, the RC time constant of the rising node gets very low, resulting in a very fast transition. The falling node, where the switch is off, has an effective impedance of the termination resistor $R_t$ parallel with line impedance $Z_o$, thus experiencing a considerably larger time constant than the rising node. This difference in the time constants on the two output nodes results in a rather large output common-mode voltage. Common-mode voltage is not desirable in most wireline applications, especially Ethernet over unshielded twisted pair, as it cause the wire to radiate electromagnetic waves and cause interference that violates FCC regulations. To avoid this common-mode effect, a transformer must be used to cancel out the common-mode component of the transmitted signal. The requirement for a transformer makes the solution more expensive and less desirable especially for very high-speed application as the transformer cost also goes up with frequency of operation.

It should be noted that in all above mentioned designs, the driver output amplitude can be controlled by modulating the amplitude of the current in the current sources.

Accordingly, what is desired is that a line driver circuit is provided that overcomes the above-identified problems. The present invention addresses such a need.

SUMMARY OF THE INVENTION

A low-power multi-level pulse amplitude modulation (PAM) line driver using variable resistors is disclosed for transmitting digital data over controlled-impedance transmission lines. The driver comprises two push-pull variable resistor branches, and a middle variable resistor branch. The purpose of the two push-pull branches is to generate the target voltage level onto the line, and the middle branch ensures that at all times the effective parallel impedance of the resistors matches to the line impedance. The values of the variable resistors are selected by a driver code logic whose input is the raw data bits. Each set of raw data bits is converted to a specific analog voltage level by the driver. The driver requires a supply voltage that is equal or higher than twice the absolute maximum output signal level. This supply voltage can be the supply voltage supplied to the chip itself or a regulated supply voltage adjusted to result in a certain voltage swing.

The present invention discloses the design of a multi-level PAM driver for high-speed wireline communication, with up to four times improvement in power efficiency over conventional drivers. Two key requirements for high-speed line drivers are first generating the target voltage level onto the controlled-impedance line, and second being impedance-matched to the line itself to eliminate signal reflections from the transmitter back to the line. The driver in accordance with the present invention satisfies both of these requirements at very high power efficiency.

BRIEF DESCRIPTION OF THE DRAWINGS

FIG. 1 illustrates a conventional source/emitter-coupled line driver.

FIG. 2 illustrates a conventional H-bridge push-pull line driver.

FIG. 3 illustrates a modified H-bridge line driver for low-voltage operation.

DETAILED DESCRIPTION OF THE INVENTION

Figures 4A, 4B:
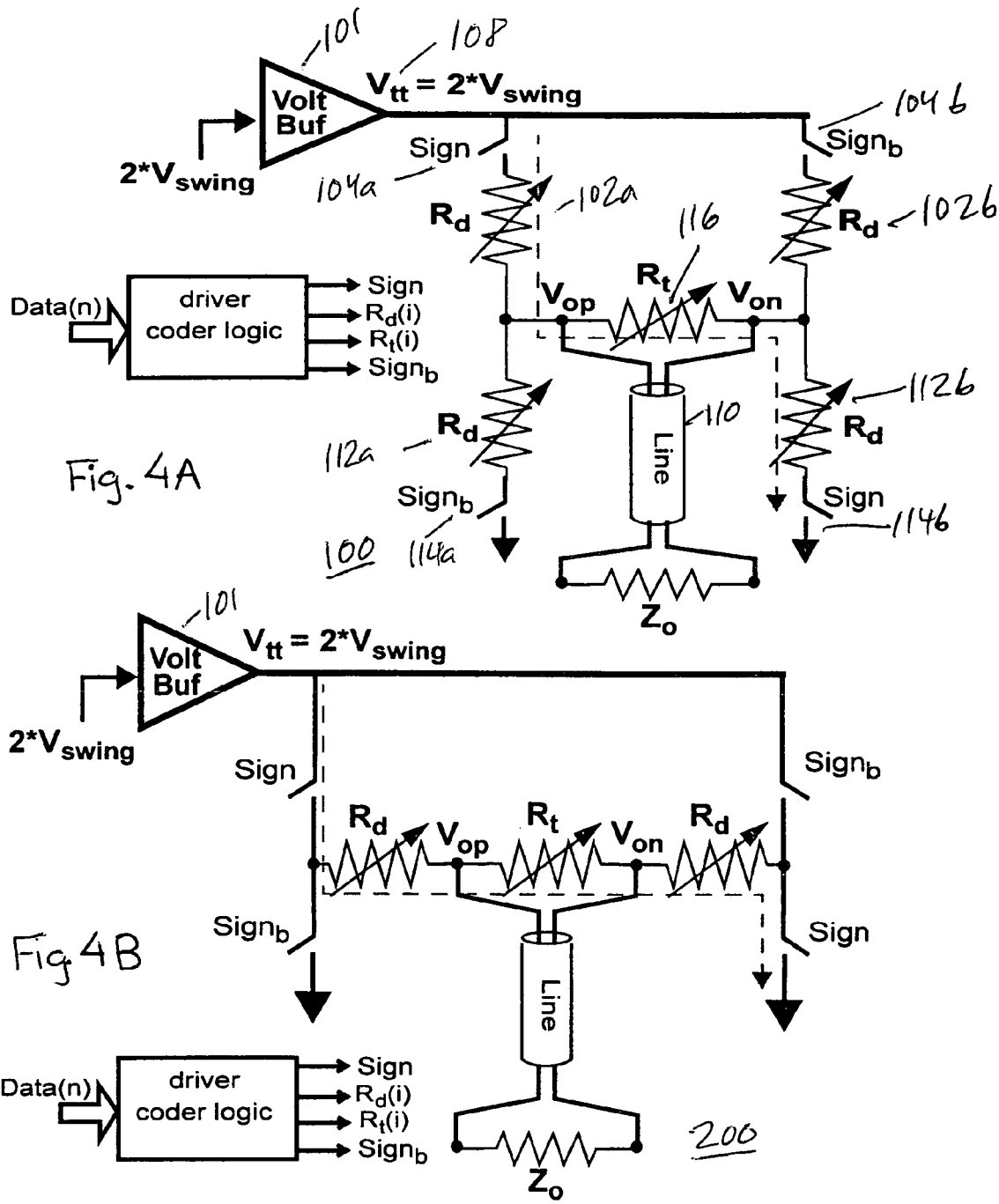
FIG. 4A illustrates a first embodiment of a variable-resistor multi-level line driver in accordance with the present invention.
FIG. 4B illustrates a second embodiment of a variable resistor multilevel driver in accordance with the present invention.

The present invention relates generally to the field of communications, and in particular, to line drivers utilized for communications. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

FIGS. 4A and 4B illustrate two embodiments for a variable-resistor line driver circuit in accordance with the present invention. Both of the embodiments have the capability to generate a continuous range of output signal swings, while maintaining an effective impedance equal to line differential line impedance, $Z_o$. The two embodiments differ in the way the resistor pull up and pull down switching is done.

The line driver circuit 100 of FIG. 4A comprises two pull-up variable resistors, $R_d$, 102a and 102b, and series switch combination 104a and 104b connected between a voltage source, $V_{tt}$, 108 and output line 110, plus two pull-down variable resistors 112a and 112b and switches 114a and 114b connected between ground (or negative supply) and output lines, plus a floating variable resistor 116 connected across the output lines 110. The line driver circuit 200 of FIG. 4B is a illustrates a topology that shares a variable resistor for pull-up and pull-down path. In particular, the line driver circuit 200 of FIG. 4 includes a first switch connected between a first power supply and a first node; a second switch connected between the first power supply and a second node; a third switch connected between the first node and a second power supply; a fourth switch connected between the second node and the second power supply; a first variable resistor connected between the first node and the first output terminal; a second variable resistor connected between the second node and the second output terminal; a floating variable resistor connected between the first output terminal and the second output terminal. By sharing the switching node driver 200 saves two variable resistors, and at the same time reduces the effective RC introduced to the output node as a result of reduced switch capacitances. On the other hand, driver 100 can generate an output voltage with a controlled common-mode voltage if the pull-up and pull-down resistors are set differently. Each of the drivers 100 and 200 convert each group of n data bits into an output voltage level at a fixed output impedance in this driver, a coder logic 120 and 220 is required to digitally set the appropriate value of the variable resistors. The coder logic also sets the sign of the output voltage based on a data digital value. A voltage buffer 101 regulates the top rail voltage, $V_{tt}$, of the driver structure to twice of the maximum signal swing, $V_{swing}$, expected.

The goal is to produce and launch a voltage into the line, positive or negative, whose amplitude is adjustable from zero to $V_{swing}$, and the driver's power/current consumption reduces with the output swing. To explain the operation of the cell, the following example is used. Let's consider launching a positive signal, i.e. $V_{swing} > V_{op} - V_{on} > 0$, into the line. In this case, the sign signal, Sign, is high and $Sign_b$ is low. The current path then is as shown with the dotted line in FIGS. 4A and 4B. The voltage across the output line is the result of voltage division over three resistors, the two switched resistors $R_d$ in the path and the parallel of $R_t$ and the line impedance $Z_o$. So for $V_{out}$ we have:

$$V_{out} = 2V_{swing} \cdot \frac{Z_o \| R_t}{2R_d + Z_o \| R_t} \quad \text{Eq 1}$$

So by varying the two resistor in the line driver, $R_d$ and $R_t$, the output voltage is adjustable from $V_{out} = 0$, where $R_d$=Infinite and $R_t = Z_o$, and $V_{out} = V_{swing}$, where $R_d = Z_o/2$ and $R_t$=Infinite. However, the two resistor at the same time must ensure an effective output impedance equal to that of the line impedance, so we have:

$$(R_d + R_d) \| R_t = Z_o \quad \text{Eq 2}$$

Solving for $R_t$ we have:

$$R_t = \frac{R_d \times Z_o}{R_d - Z_o/2} \quad \text{Eq 3}$$

The above equation shows that the minimum value for $R_d$ is $Z_o/2$ and minimum value for $R_t$ is $Z_o$.

The current consumption of this driver to launch a swing of $V_{out}$ into the line is:

$$I_{drive} = \frac{2V_{swing}}{2R_d + R_t \| Z_o} \quad \text{Eq 4}$$

where $R_d$ and $R_t$ are calculated based on equations (1) and (2) for a given $V_{out}$.

For example, to have the maximum output swing of $V_{out} = V_{swing}$ and for a line impedance of $Z_o = 100\Omega$, we have $R_d = 50\Omega$ and $R_t$=Infinite, leading to a maximum current consumption of:

$$I_{max} = \frac{V_{swing}}{100\Omega} \quad \text{Eq 5}$$

This drive current also scales down with lower output voltage, although not linearly, for example for the same above line impedance but a swing of $V_{out} = V_{swing}/2$, we have: $R_d = 100\Omega$ and $R_t = 200\Omega$, and thus:

$$I_{max} = \frac{V_{swing}}{133\Omega} \qquad \text{Eq 6}$$

So for a maximum swing of $V_{swing}=1V$ (or 2V differential pk—pk), as in 100/1000BaseT, the current consumption for maximum output voltage (2V differential pk—pk) is 10 mA, and for half of that output voltage (1V differential pk—pk) is 7.5 mA.

The above current numbers compared to a conventional source-coupled (or emitter-coupled) driver of FIG. 1, shows the clear power advantage of the proposed block for providing a certain output voltage. For the conventional driver, to deliver a max swing of 1V (or 2V differential pk—pk) into the line, the driver current must be four times that of the inventive design:

$$I_{drive} = \frac{V_{swing}}{Z_o/4} = 4 \cdot \frac{V_{swing}}{Z_o} \qquad \text{Eq 7}$$

The inventive design also has a power advantage over other lower power designs such as H-bridge line driver, as shown in FIG. 2. As the H-bridge driver both sources and sinks current at the same time, its current efficiency is twice that of the conventional source-coupled design, but still almost half the proposed design. To repeat above example again, for delivering a max swing of 1V (or 2V differential pk—pk) into the line, the driver current must be two times that of the proposed design:

$$I_{drive} = \frac{V_{swing}}{Z_o/2} = 2 \cdot \frac{V_{swing}}{Z_o} \qquad \text{Eq 8}$$

However, in the H-bridge design to keep the current sources in saturation, it requires twice the headroom of a conventional source-coupled design for the current source devices, thus typically requiring a higher supply voltage. The inventive design does not suffer from this drawback either as the resistors do not require any headroom at all to preserve their value and thus source or sink the correct current.

One of the other very important advantages of the line driver in accordance with the present invention is the fact that the current driven into the link does not vary as a result of large variations of line voltage. The other above mentioned conventional designs as a result of requiring current source devices are subject to channel length modulation for the output current as a result of large output voltage variations. This property of the inventive design is very crucial for applications such as 1000BaseT, that uses bidirectional signaling, where the output voltage is super-imposed by the incoming signal that can be as large as 2V differential pk—pk by itself, resulting in up to 4V differential pk—pk swing (or 2Vswing on either side).

One of the main advantages of the proposed driver design in the line driver circuit of FIG. 4A is that the output common mode of the driver can be adjusted by having different pull-up and pull-down resistors. So as long as the differential impedance of the stage stays the same, meaning:

$$(R_{dup}+R_{ddown}) \| R_t = Z_o \qquad \text{Eq 9}$$

the signal common-mode can be shifted to a higher or lower voltage than half the regulated voltage. Such a common-mode shift comes at no trade off in this driver, but results in a rather considerable trade off in the conventional drivers. In the source/emitter coupled driver, common-mode shift results in more power consumption proportional to the common-mode shift. In the H-bridge driver, it increases the headroom requirement or in some case may not leave enough headroom for the current sources to operate properly.

It is also very important to note that due to the flexibility of this inventive design, the regulated supply is restricted to twice the voltage swing level at the minimum, but there is no limitation on its maximum the value. As an option, to do without an extra regulated power supply for the driver, one can simply use the off-chip supply that is rated to be always higher than twice the required output swing. For example to support an output swing of 1V single-ended, one can use the 2.5V supply, that may go as low as 10% lower due to voltage tolerances and IR drops, and still get the required output swing and termination by proper choice of the resistors in the driver.

Advantages

1. Low power: Almost 75% less power compared to the conventional source-coupled (emitter-coupled) line driver, and 50% less power compared to the H-bridge driver.

2. Low supply voltage: Does not require a high supply voltage as there is not much headroom requirement by the resistor structure. What limits the minimum required supply voltage for a certain output swing is ensuring the effective output impedance of the driver is equal to the line impedance for a required output swing.

3. The driver supply voltage can assume a range of values for a given output swing above the minimum required supply (minimum being $2*V_{swing}$) by proper choice of resistor values in the driver branches.

4. No output current modulation: Since the proposed design is not a current source driver, it does not suffer from channel length modulation that results in output current modulation as a result of large voltage variations at the output.

5. Adjustable output common-mode voltage at no trade off for extra power or headroom requirement.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A line driver circuit including a first output terminal and a second output terminal, the line driver circuit comprising:

a first pull-up variable resistor and a first switch connected in series between a first power supply and the first output terminal;

a second pull-up variable resistor and a second switch connected in series between the first power supply and the second output terminal;

a first pull-down variable resistor and a third switch connected in series between a second power supply and the first output terminal;

a second pull-down variable resistor and a fourth switch connected in series between the second power supply and the second output terminal;

a floating variable resistor connected between the first output terminal and the second output terminal; and coder logic to receive data bits and adjust an output voltage across the first output terminal and the second output terminal by varying a resistance of one or more of the floating variable resistor, the first pull-up variable resistor, the second pull-up variable resistor, the first pull-down variable resistor, and the second pull-down variable resistor responsive to the received data bits, wherein the coder logic is further operable to vary a resistance of one or more of the floating variable resistor, the first pull-up variable resistor, the second pull-up variable resistor, the first pull-down variable resistor, and the second pull-down variable resistor to maintain an effective output impedance for the line driver circuit that equals an impedance of a transmission line connected to the first output terminal and the second output terminal, and wherein the coder logic is further operable to set the resistance of the first pull-up variable resistor and the second pull-up variable resistor to a value that is different from the resistance of the first pull-down variable resistor and the second pull-down variable resistor to generate a controlled common-mode voltage associated with the adjustable output voltage.

2. A line driver circuit including a first output terminal and a second output terminal, the line driver circuit comprising:

a first pull-up variable resistor and a first switch connected in series between a first power supply and the first output terminal;

a second pull-up variable resistor and a second switch connected in series between the first power supply and the second output terminal;

a first pull-down variable resistor and a third switch connected in series between a second power supply and the first output terminal;

a second pull-down variable resistor and a fourth switch connected in series between the second power supply and the second output terminal;

a floating variable resistor connected between the first output terminal and the second output terminal;

coder logic to receive data bits and adjust an output voltage across the first output terminal and the second output terminal by varying a resistance of one or more of the floating variable resistor, the first pull-up variable resistor, the second pull-up variable resistor, the first pull-down variable resistor, and the second pull-down variable resistor responsive to the received data bits; and a voltage regulator to regulate a voltage of the first power supply to twice a maximum signal swing of the adjustable output voltage.

3. The line driver circuit of claim 2, wherein the coder logic is further operable to vary a resistance of one or more of the floating variable resistor, the first pull-up variable resistor, the second pull-up variable resistor, the first pull-down variable resistor, and the second pull-down variable resistor to maintain an effective output impedance for the line driver circuit that equals an impedance of a transmission line connected to the first output terminal and the second output terminal.

4. The line driver circuit of claim 2, wherein the adjustable output voltage is adjustable from zero to the maximum signal swing.

5. The line driver circuit of claim 4, wherein power consumption of the line driver circuit is directly proportional to the adjustable output voltage.

6. The line driver circuit of claim 5, wherein a drive current associated with the line driver circuit is directly proportional to the adjustable output voltage.

7. The line driver circuit of claim 2, wherein the coder logic is operable to digitally set the resistance of each of the floating variable resistor, the first pull-up variable resistor, the second pull-up variable resistor, the first pull-down variable resistor, and the second pull-down variable resistor.

8. The line driver circuit of claim 2, wherein the line driver circuit is a multi-level pulse amplitude modulation (PAM) line driver circuit.

9. The line driver of claim 8, wherein the multi-level pulse amplitude modulation (PAM) line driver circuit is compliant with 100Base-T or 1000Base-T protocols.

10. A line driver circuit including a first output terminal and a second output terminal, the line driver circuit comprising:

a first switch connected between a first power supply and a first node;

a second switch connected between the first power supply and a second node;

a third switch connected between the first node and a second power supply;

a fourth switch connected between the second node and the second power supply;

a first variable resistor connected between the first node and the first output terminal;

a second variable resistor connected between the second node and the second output terminal;

a floating variable resistor connected between the first output terminal and the second output terminal;

coder logic to receive data bits and adjust an output voltage across the first output terminal and the second output terminal by varying a resistance of one or more of the floating variable resistor, the first variable resistor, and the second variable resistor responsive to the received data bits; and a voltage regulator to regulate a voltage of the first power supply to twice a maximum signal swing of the adjustable output voltage.

11. The line driver circuit of claim 10, wherein the coder logic is further operable to vary a resistance of one or more of the floating variable resistor, the first variable resistor, and the second variable resistor to maintain an effective output impedance for the line driver circuit that equals an impedance of a transmission line connected to the first output terminal and the second output terminal.

12. The line driver circuit of claim 10, wherein the adjustable output voltage is adjustable from zero to the maximum signal swing.

13. The line driver circuit of claim 12, wherein power consumption of the line driver circuit is directly proportional to the adjustable output voltage.

14. The line driver circuit of claim 13, wherein a drive current associated with the line driver circuit is directly proportional to the adjustable output voltage.

15. The line driver circuit of claim 13, wherein the coder logic is operable to digitally set the resistance of each of the floating variable resistor, the first variable resistor, and the second variable resistor.

16. The line driver circuit of claim 10, wherein the line driver circuit is a multi-level pulse amplitude modulation (PAM) line driver circuit.

17. The line driver of claim 16, wherein the multi-level pulse amplitude modulation (PAM) line driver circuit is compliant with 100Base-T or 1000Base-T protocols.

* * * * *